(12) United States Patent　(10) Patent No.: US 11,387,427 B2
Dai et al.　(45) Date of Patent: Jul. 12, 2022

(54) DISPLAY PANEL AND METHOD OF MANUFACTURING THE SAME, AND DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Yuli Dai, Beijing (CN); Qiang Xiong, Beijing (CN); Chao Liu, Beijing (CN); Min Li, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 225 days.

(21) Appl. No.: 16/718,869

(22) Filed: Dec. 18, 2019

(65) Prior Publication Data

US 2020/0127227 A1　Apr. 23, 2020

Related U.S. Application Data

(63) Continuation-in-part of application No. PCT/CN2018/118542, filed on Nov. 30, 2018.

(30) Foreign Application Priority Data

Apr. 2, 2018　(CN) .......................... 201810282718.2

(51) Int. Cl.
　*H01L 51/52*　(2006.01)
　*B32B 7/12*　(2006.01)
　(Continued)

(52) U.S. Cl.
　CPC ............ *H01L 51/5246* (2013.01); *B32B 7/12* (2013.01); *B32B 37/12* (2013.01); *B32B 37/16* (2013.01);
　(Continued)

(58) Field of Classification Search
　CPC ............ H01L 51/5246; H01L 27/3244; H01L 51/0024; H01L 51/5259; H01L 51/56;
　(Continued)

(56) References Cited

U.S. PATENT DOCUMENTS

2014/0319998 A1* 10/2014 Han ........................ H05B 33/04
　313/504
2016/0223880 A1　8/2016 Lee
　(Continued)

FOREIGN PATENT DOCUMENTS

CN　104064674 A　9/2014
CN　104064682 A　9/2014
　(Continued)

OTHER PUBLICATIONS

International Search Report and Written Opinion issued in corresponding International Patent Application No. PCT/CN2018/118542, dated Mar. 6, 2019, with English language translation.
(Continued)

*Primary Examiner* — Ermias T Woldegeorgis
(74) *Attorney, Agent, or Firm* — McDermott Will & Emery LLP

(57) ABSTRACT

A display panel includes a display substrate, an opposite substrate, and a hydrophobic bonding portion disposed between the display substrate and the opposite substrate. The hydrophobic bonding portion is configured to bond the display substrate and the opposite substrate together, and an
(Continued)

orthographic projection of the hydrophobic bonding portion on the display substrate is located outside a display region of the display substrate.

16 Claims, 6 Drawing Sheets

(51) Int. Cl.
| | |
|---|---|
| *B32B 37/12* | (2006.01) |
| *B32B 37/16* | (2006.01) |
| *B32B 38/00* | (2006.01) |
| *H01L 27/32* | (2006.01) |
| *H01L 51/00* | (2006.01) |
| *H01L 51/56* | (2006.01) |

(52) U.S. Cl.
CPC ...... *B32B 38/0008* (2013.01); *H01L 27/3244* (2013.01); *H01L 51/0024* (2013.01); *H01L 51/5259* (2013.01); *H01L 51/56* (2013.01); *B32B 2305/72* (2013.01); *B32B 2307/728* (2013.01); *B32B 2307/73* (2013.01); *B32B 2310/0831* (2013.01); *B32B 2457/206* (2013.01)

(58) Field of Classification Search
CPC ... H01L 2251/5346; B32B 7/12; B32B 37/12; B32B 37/16; B32B 38/0008; B32B 2305/72; B32B 2307/728; B32B 2307/73; B32B 2310/0831; B32B 2457/206
See application file for complete search history.

(56) References Cited

U.S. PATENT DOCUMENTS

| | | |
|---|---|---|
| 2018/0287097 A1 | 10/2018 | Ni et al. |
| 2019/0101775 A1 | 4/2019 | Zhao et al. |
| 2020/0127227 A1 | 4/2020 | Dai et al. |

FOREIGN PATENT DOCUMENTS

| | | |
|---|---|---|
| CN | 104124390 A | 10/2014 |
| CN | 106896588 A | 6/2017 |
| CN | 106935726 A | 7/2017 |
| CN | 108511622 A | 9/2018 |
| KR | 10-2016-0094520 A | 8/2016 |

OTHER PUBLICATIONS

First Chinese Office Action issued in corresponding Chinese Application No. 201810283718.2, dated Mar. 5, 2019, with English language translation.
Second Chinese Office Action issued in corresponding Chinese Application No. 201810283718.2, dated Aug. 6, 2019, with English language translation.
Third Chinese Office Action issued in corresponding Chinese Application No. 201810283718.2, dated Oct. 25, 2019, with English language translation.

* cited by examiner

DISPLAY PANEL AND METHOD OF MANUFACTURING THE SAME, AND DISPLAY DEVICE

CROSS-REFERENCE TO RELATED APPLICATIONS

This application is a Continuation in part of Application of PCT/CN2018/118542 filed on Nov. 30, 2018, which claims priority to Chinese Patent Application No. 201810282718.2, filed on Apr. 2, 2018, titled "A DISPLAY PANEL AND METHOD OF MANUFACTURING THE SAME, AND DISPLAY DEVICE", which are incorporated herein by reference in their entirety.

TECHNICAL FIELD

The present disclosure relates to the field of display technologies, and in particular, to a display panel and a method of manufacturing the same, and a display device.

BACKGROUND

Organic light-emitting diode (OLED) display panel is a kind of active light-emitting flat display panel with a wide viewing angle. By applying display signals to light-emitting devices in the OLED display panel, the light-emitting devices can be driven to emit light. Therefore, OLED display panels have the advantages of thin thickness and light weight.

SUMMARY

In an aspect, a display panel is provided. The display panel includes a display substrate, an opposite substrate, and a hydrophobic bonding portion disposed between the display substrate and the opposite substrate. The hydrophobic bonding portion is configured to bond the display substrate and the opposite substrate together, and an orthographic projection of the hydrophobic bonding portion on the display substrate is located outside a display region of the display substrate.

In some embodiments, the display panel further includes a hydrophilic bonding portion disposed between the display substrate and the opposite substrate. The hydrophilic bonding portion is configured to bond the display substrate and the opposite substrate together, and an orthographic projection of the hydrophilic bonding portion on the display substrate is located between the orthographic projection of the hydrophobic bonding portion on the display substrate and the display region of the display substrate.

In some embodiments, materials of the hydrophobic bonding portion include a first base material and a hydrophobic material, and materials of the hydrophilic bonding portion include a second base material and a hydrophilic material.

In some embodiments, arrangement manners of the hydrophobic material include at least one of the following arrangement manners: the hydrophobic material is dispersed in the first base material; or the hydrophobic material includes a plurality of hydrophobic groups, and the plurality of hydrophobic groups are connected to the first base material.

In some embodiments, arrangement manners of the hydrophilic material include at least one of the following arrangement manners: the hydrophilic material is dispersed in the second base material; or the hydrophilic material includes a plurality of hydrophilic groups, and the plurality of hydrophilic groups are connected to the second base material.

In some embodiments, the orthographic projection of the hydrophobic bonding portion on the display substrate and the orthographic projection of the hydrophilic bonding portion on the display substrate are both located within a frame region of the display substrate; and along a direction from the frame region of the display substrate to the display region of the display substrate, a mass percentage of the hydrophobic material in the hydrophobic bonding portion gradually decreases, and a mass percentage of the hydrophilic material in the hydrophilic bonding portion gradually increases.

In some embodiments, a mass percentage of the hydrophobic material in the materials of the hydrophobic bonding portion is greater than a mass percentage of the hydrophilic material in the materials of the hydrophilic bonding portion.

In some embodiments, a mass percentage of the hydrophobic material in the materials of the hydrophobic bonding portion is 10%~40%; and a mass percentage of the hydrophilic material in the materials of the hydrophilic bonding portion is 5%~20%.

In some embodiments, the hydrophobic material includes at least one of plastic particles, hydrophobic nano-silica, or paraffin; and the hydrophilic material includes at least one of anhydrous magnesium sulfate, silica gel, cellulose, aldehyde ketone resin, or acetone.

In some embodiments, any one of the plurality of hydrophobic groups is selected from a group consisting of a hydrocarbon group, an aryl group, an ester group, a nitro group, or a halogen atom; and any one of the plurality of hydrophilic groups is selected from a group consisting of a hydroxyl group, a carbonyl group, or an aldehyde group.

In some embodiments, a mass percentage of the first base material in the materials of the hydrophobic bonding portion is less than a mass percentage of the second base material in the materials of the hydrophilic bonding portion.

In some embodiments, the first base material includes at least one of an ultraviolet curing adhesive or a heat curing adhesive; and the second base material includes at least one of an ultraviolet curing adhesive or a heat curing adhesive.

In some embodiments, materials of the opposite substrate include a hydrophilic material with a mass percentage of 2%~5%, and the hydrophilic material is distributed on a surface of the opposite substrate facing the display substrate.

In some embodiments, the hydrophobic bonding portion surrounds the display region; and the hydrophilic bonding portion is disposed at at least one of a plurality of side surfaces of the hydrophobic bonding portion facing the display region.

In some embodiments, the display panel further includes a gap disposed between the hydrophobic bonding portion and the hydrophilic bonding portion.

In another aspect, a method of manufacturing a display panel is provided. The method includes: providing a display substrate and an opposite substrate; and forming a hydrophobic bonding portion between the display substrate and the opposite substrate. The hydrophobic bonding portion is configured to bond the display substrate and the opposite substrate together, and an orthographic projection of the hydrophobic bonding portion on the display substrate is located outside a display region of the display substrate.

In some embodiments, the method of manufacturing the display panel further includes: forming a hydrophilic bonding portion between the display substrate and the opposite substrate. The hydrophilic bonding portion is configured to bond the display substrate and the opposite substrate together, and an orthographic projection of the hydrophilic bonding portion on the display substrate is located between the orthographic projection of the hydrophobic bonding portion on the display substrate and the display region of the display substrate.

In some embodiments, forming a hydrophobic bonding portion between the display substrate and the opposite substrate, includes: forming a hydrophobic bonding portion in a frame region of a surface of the display substrate configured to face the opposite substrate. Forming a hydrophilic bonding portion between the display substrate and the opposite substrate, includes: forming a hydrophilic bonding portion in the frame region of the surface of the display substrate configured to face the opposite substrate.

The method of manufacturing the display panel further includes: placing the surface of the display substrate formed with the hydrophobic bonding portion and the hydrophilic bonding portion opposite to the opposite substrate, so that the hydrophobic bonding portion and the hydrophilic bonding portion bond the opposite substrate to the display substrate.

In some other embodiments, forming a hydrophobic bonding portion between the display substrate and the opposite substrate, includes: forming a hydrophobic bonding portion in a frame region of a surface of the opposite substrate configured to face the display substrate. Forming a hydrophilic bonding portion between the display substrate and the opposite substrate, includes: forming a hydrophilic bonding portion in the frame region of the surface of the opposite substrate configured to face the display substrate.

The method further includes: placing the surface of the opposite substrate formed with the hydrophobic bonding portion and the hydrophilic bonding portion opposite to the display substrate, so that the hydrophobic bonding portion and the hydrophilic bonding portion bond the display substrate to the opposite substrate.

In some embodiments, the method of manufacturing the display panel further includes: performing a curing treatment on the hydrophobic bonding portion and the hydrophilic bonding portion that are formed between the display substrate and the opposite substrate The curing treatment includes at least one of the following treatments: an ultraviolet light irradiation treatment or a heat treatment.

In yet another aspect, a display device is provided. The display device includes the display panel described above.

BRIEF DESCRIPTION OF THE DRAWINGS

In order to describe technical solutions in some embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In the following, the terms "first" and "second" are used for descriptive purposes only and are not to be construed as indicating or implying relative importance or implicitly indicating the number of indicated technical features. Thus, features defined as "first", "second" may explicitly or implicitly include one or more of the features.

In the description of the embodiments of the present disclosure, "a plurality of" means two or more unless otherwise specified. The term "one or more" or "at least one", at least in part depending on the context, may be used to describe any feature, structure, or characteristic in the singular, or may be used to describe a combination of features, structures, or characteristics in the plural. The term "and/or" merely describes an association of associated objects, which include three situations. For example, "A and/or B" refers to three situations: A alone, A and B, and B alone. If "at least one" is used before several objects, such as "at least one of A or B", it should be understood as "only A, only B, or both A and B". Similarly, at least in part depending on the context, terms such as "one" or "the" may be understood in the singular sense or in the plural sense.

In addition, in the description of embodiments of the present disclosure, orientations or positional relationships indicated by terms "upper/above", "lower/below", etc. are based on orientations or positional relationships shown in the accompanying drawings, merely for the convenience of explaining simplified descriptions of the technical solutions of the present disclosure, but not to indicate or imply that the referred devices or elements must have a particular orientation, or must be constructed or operated in a particular orientation. Therefore, they should not be construed as limitations to the present disclosure.

Figure 1:
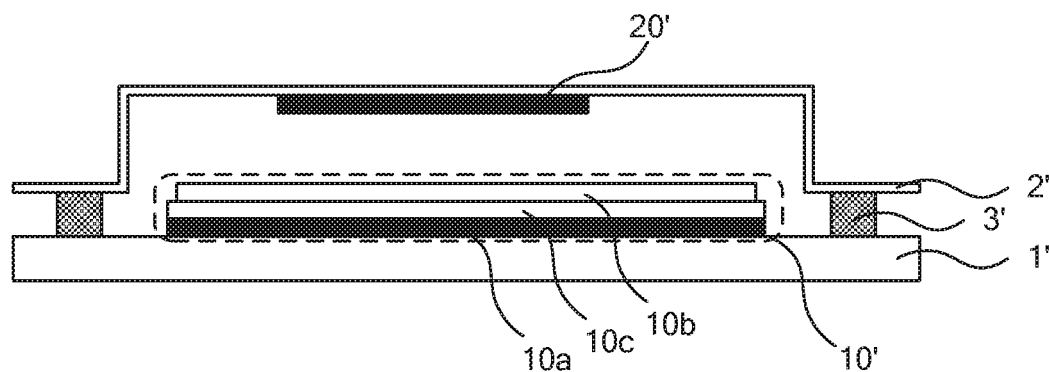
FIG. 1 is a schematic cross-sectional view of an organic light-emitting diode (OLED) display panel taken along a thickness direction thereof according to an exemplary embodiment of the present disclosure.

FIG. 1 is a schematic cross-sectional view of an organic light-emitting diode (OLED) display panel taken along a thickness direction thereof according to an exemplary embodiment of the present disclosure. As shown in FIG. 1, in an exemplary embodiment of the present disclosure, the OLED display panel includes an OLED display substrate and an encapsulating cover plate 2' provided above the OLED display substrate 1'.

The OLED display substrate 1' includes a base substrate, a thin film transistor (TFT) array layer disposed on the base substrate, and a plurality of OLED devices 10' disposed on the TFT array layer. The plurality of OLED devices 10' arranged, for example, in an array. Each OLED device 10' is electrically connected to a corresponding TFT. Each OLED device 10' includes a first electrode 10a, a light-emitting layer 10c, and a second electrode 10b that are disposed in a stack.

It will be understood that, for ease of illustration, in FIG. 1, first electrodes 10a in the plurality of OLED devices 10' are represented by only one layer. Light-emitting layers 10c and second electrodes 10b in the plurality of OLED devices 10' are illustrated in a same way, and details are not described herein again.

For example, each OLED device 10' further includes other functional layer(s) disposed between the first electrode 10a and the light-emitting layer 10c; for example, each OLED device 10' further includes other functional layer(s) disposed between the second electrode 10b and the light-emitting layer 10c.

In a case where the first electrode 10a or the second electrode 10b is a cathode, the other functional layer(s) disposed between the cathode and the light-emitting layer 10c include an electron transport layer. In a case where the first electrode 10a or the second electrode 10b is an anode, the other functional layer(s) disposed between the anode and the light-emitting layer 10c include at least one of a hole injection layer or a hole transport layer.

Further, in a case where the hole injection layer and the hole transport layer are provided between the anode and the light-emitting layer 10c, in order to improve an efficiency of transporting holes from the anode to the light-emitting layer 10c, the hole transport layer is provided proximate to the light-emitting layer 10c, and the hole injection layer is provided proximate to the anode.

As shown in FIG. 1, in order to prevent moisture in the external environment from affecting a service life of the OLED device 10', the OLED display panel generally further includes a light-curing adhesive 3', and the encapsulating cover plate 2' and the OLED display substrate 1' are encapsulated together by the light-curing adhesive 3'. However, the conventional light-curing adhesive 3' has a limited barrier effect against water vapor. Therefore, the OLED display panel generally further includes a drying sheet 20' disposed on a surface of the encapsulating cover plate 2' facing the OLED display substrate 1', so as to use the drying sheet 20' to absorb moisture in a region between the OLED display substrate 1 'and the encapsulating cover plate 2'. However, in this way, a thickness of the OLED display panel will be increased, which is not conducive for making OLED display panels lighter and thinner.

Further, since the drying sheet 20' is generally opaque (e.g., black) and has a small light transmittance, it may be difficult for light emitted by the OLED device 10' to exit through the encapsulating cover plate 2; or, a loss of light after light exits through the encapsulating cover plate 2' may be very large. Therefore, in the OLED display panel provided with the drying sheet 20', the OLED devices 10' are generally bottom-emission type devices. That is, light emitted by each OLED device 10' travels toward the base substrate of the OLED display substrate 1' that is away from the encapsulating cover plate 2', and then exits from the base substrate to display a corresponding image. In this way, a design manner of the OLED device 10' is limited, and it is difficult to apply top-emission type OLED devices (that is, OLED devices that emit light toward the encapsulating cover plate 2') or bidirectional emission type OLED devices in the OLED display panel.

Figure 2:
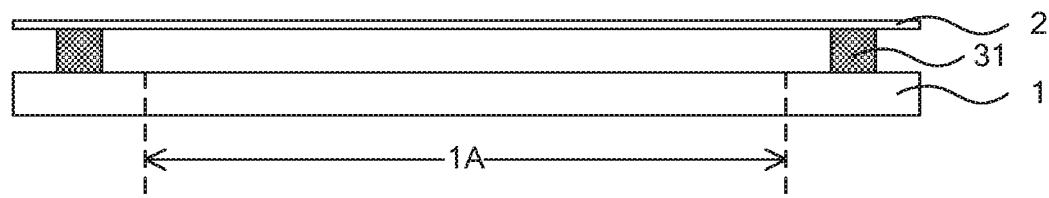
FIG. 2 is a schematic cross-sectional view of a display panel taken along a thickness direction thereof according to some embodiments of the present disclosure.

FIG. 2 is a schematic cross-sectional view of a display panel taken along a thickness direction thereof according to some embodiments of the present disclosure. As shown in FIG. 2, some embodiments of the present disclosure provide a display panel, and the display panel includes a display substrate 1, an opposite substrate 2, and a hydrophobic bonding portion 31 disposed between the display substrate 1 and the opposite substrate 2. The hydrophobic bonding portion 31 is configured to bond the display substrate 1 and the opposite substrate 2 together. That is, the hydrophobic bonding portion 31 has hydrophobic properties and adhesiveness. Moreover, an orthographic projection of the hydrophobic bonding portion 31 on the display substrate 1 is located outside a display region 1A of the display substrate 1, and does not affect normal display of the display panel.

It will be noted that, a size of the display region 1A in FIG. 2 is merely schematic, and some embodiments of the present disclosure are not limited thereto, as long as the hydrophobic bonding portion 31 is disposed outside the display region 1A of the display substrate 1. Moreover, a shape of the opposite substrate 2 in FIG. 2 is merely schematic, and some embodiments of the present disclosure are not limited thereto. The shape of the opposite substrate 2 may be designed according to specific structural requirements of the display panel.

In this way, on a basis of bonding the display substrate 1 and the opposite substrate 2 together, it may be possible to prevent the moisture in the environment from entering a region between the display substrate 1 and the opposite substrate 2 through the hydrophobic bonding portion 31. As a result, the moisture may be prevented from damaging internal components of the display panel, and an ability of the display panel to resist moisture corrosion may be improved. Therefore, there is no need to provide a drying sheet on a surface of the opposite substrate 2 in the display panel, and an increase in a thickness of the display panel may be avoided, which is conducive for making the display panel thinner.

Figure 3:
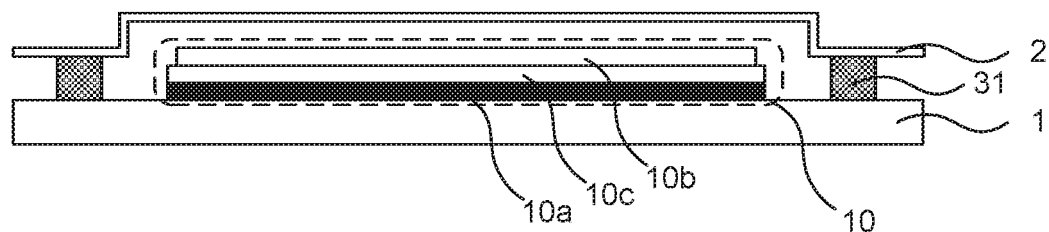
FIG. 3 is a schematic cross-sectional view of another display panel taken along a thickness direction thereof according to some embodiments of the present disclosure.

FIG. 3 is a schematic cross-sectional view of another display panel taken along a thickness direction thereof according to some embodiments of the present disclosure. As shown in FIG. 3, the display substrate 1 is an OLED display substrate. That is, the display substrate includes a plurality of OLED devices 10, and the display region 1A is a collection of regions where each OLED device 10 is located. As for a structure of each OLED device 10, reference may be made to the forgoing description, and details are not described herein again.

The display substrate 1 provided in some embodiments of the present disclosure may also be other types of display substrates sensitive to moisture, such as a photoluminescent display substrate.

In an example where the display substrate 1 is an OLED display substrate, since there is no need to provide a drying sheet in the display panel provided in some embodiments of the present disclosure, a manner in which the OLED devices 10 emit light may not be affected by the drying sheet.

In some examples, the OLED device 10 is a top-emission type device; a material of the first electrode 10a includes at least one of Ag (silver), Al (aluminum), Cu (copper), or other conductive materials having a high light reflectivity, and a material of the second electrode 10b includes at least one of ITO (indium tin oxide), IZO (indium zinc oxide), or other conductive materials having a high light transmittance.

In some other examples, the OLED device 10 is a bottom-emission type device; a material of the first electrode 10a includes at least one of ITO, IZO, or other conductive materials having a high light transmittance, and a material of the second electrode 10b includes at least one of Ag, Al, Cu or other conductive materials having a high light reflectivity.

In yet some other examples, the OLED device 10 is a bidirectional emission type device.

In this way, OLED devices 10 of different emission types may all be applied to different display panels provided in some embodiments of the present disclosure, so as to meet different use requirements.

In some embodiments of the present disclosure, in a case where the plurality of OLED devices 10 include OLED devices emitting light of different colors (including red, green, and blue, for example), the opposite substrate 2 is, for example, an encapsulating cover plate, and a material thereof is, for example, glass or a rigid resin.

In some other embodiments of the present disclosure, in a case where the plurality of OLED devices 10 all emit light of a same color (for example, white), the opposite substrate 2 is, for example, a color film substrate. In this way, the light of the same color emitted by the plurality of OLED devices 10 may become light of different colors after passing through the color film substrate, so that the display panel displays corresponding images.

Or, in the case where the plurality of OLED devices 10 all emit light of the same color, the opposite substrate 2 may also be an encapsulating cover plate. Further, the display panel further includes a color film substrate, a position of which in the display panel may be correspondingly adjusted according to a light-emitting type of the plurality of OLED devices, as long as the light emitted by each OLED device is able to pass through the color film substrate.

As shown in FIG. 2, in some embodiments of the present disclosure, the opposite substrate 2 may be a flat substrate. That is, a distance between the opposite substrate 2 and the display substrate 1 is equal or approximately equal in different regions of the display panel.

As shown in FIG. 3, in some other embodiments of the present disclosure, the opposite substrate 2 is stepped near four peripheral edges thereof. That is, a distance between a central region of the opposite substrate 2 and the display substrate 1 is large, and a distance between four peripheral edges of the opposite substrate 2 and the display substrate 1 is small. For example, a distance between the display substrate 1 and a portion of the opposite substrate 2 that is in contact with the hydrophobic bonding portion 31 is less than a distance between the display substrate 1 and a portion of the opposite substrate 2 corresponding to the display region 1A.

It will be noted that, although the opposite substrate 2 shown in FIG. 3 is not a flat substrate, since there is no need to provide a drying sheet in the display panel provided in some embodiments of the present disclosure, the opposite substrate 2 having the above-described stepped structure may not significantly increase the thickness of the display panel.

Figure 4:
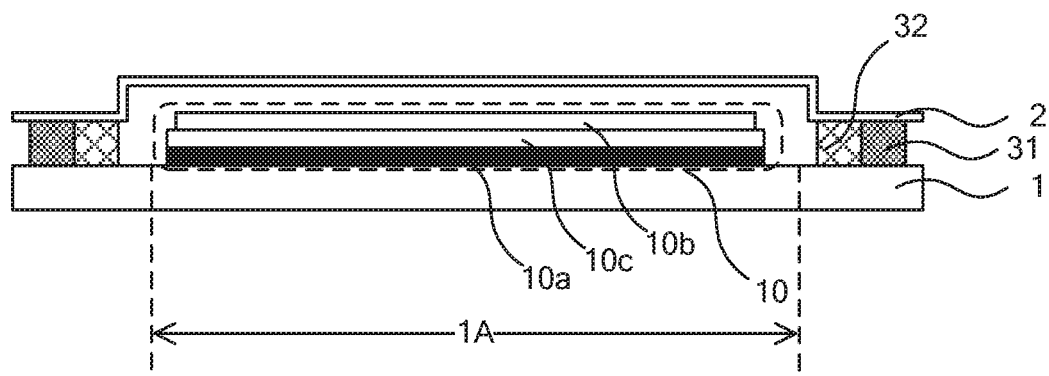
FIG. 4 is a schematic cross-sectional view of yet another display panel taken along a thickness direction thereof according to some embodiments of the present disclosure.

FIG. 4 is a schematic cross-sectional view of yet another display panel taken along a thickness direction thereof according to some embodiments of the present disclosure. As shown in FIG. 4, in some embodiments of the present disclosure, the display panel further includes a hydrophilic bonding portion 32 disposed between the display substrate 1 and the opposite substrate 2. The hydrophilic bonding portion 32 is configured to bond the display substrate 1 and the opposite substrate 2 together. That is, the hydrophilic bonding portion 32 has hydrophilic properties and adhesiveness. Moreover, an orthographic projection of the hydrophilic bonding portion 32 on the display substrate 1 is located between the orthographic projection of the hydrophobic bonding portion 31 on the display substrate 1 and the display region 1A of the display substrate 1, and does not affect the normal display of the display panel.

As for respective structures of the display substrate 1 and the opposite substrate 2, reference may be made to the forgoing description, and details are not described herein again.

In this way, the hydrophobic bonding portion 31 and the hydrophilic bonding portion 32 may jointly bond the display substrate 1 and the opposite substrate 2 together. For example, the hydrophobic bonding portion 31 and the hydrophilic bonding portion 32 may constitute an encapsulating frame bonding layer, and the hydrophobic bonding portion 31 is an outer portion of the encapsulating frame bonding layer (may also be referred to as an outer encapsulating frame portion or a hydrophobic encapsulating frame portion). Correspondingly, since the hydrophilic bonding portion 32 is located between the hydrophobic bonding portion 31 and the display region 1A, the hydrophilic bonding portion 32 is an inner portion of the encapsulating frame bonding layer (may also be referred to as an inner encapsulating frame portion or a hydrophilic encapsulating frame portion).

Based on this, when there is moisture in the external environment of the display panel, the hydrophobic bonding portion 31 may be able to block an intrusion of the moisture in the external environment, thereby reducing a probability that the moisture in the external environment enters the region between the display substrate 1 and the opposite substrate 2 through the hydrophobic bonding portion 31. Moreover, since the hydrophilic bonding portion 32 is provided between the hydrophobic bonding portion 31 and the display region 1A of the display substrate 1, due to a hydrophilicity of the hydrophilic bonding portion 32, free moisture present in the region between the display substrate 1 and the opposite substrate 2 may be adsorbed. Further, the moisture may be fixed on a surface of the hydrophilic bonding portion 32 so as to be far away from the display region 1A of the display substrate 1, thereby achieving an effect of further protecting devices in the display substrate 1.

In the above manner, by using the hydrophobic bonding portion 31 and the hydrophilic bonding portion 32, an interior of the display panel provided in some embodiments of the present disclosure may be double-protected, and an ability of the display panel to resist moisture corrosion may be improved.

Respective shapes of the hydrophobic bonding portion 31 and the hydrophilic bonding portion 32 will be described below with some embodiments. It will be understood that the following embodiments are merely examples. Specific shapes of the hydrophobic bonding portion 31 and the hydrophilic bonding portion 32 may be adjusted according to design requirements of the display panel, and some embodiments of the present disclosure are not limited thereto.

FIGS. 5A to 5D are schematic diagrams showing a partial planar structure of different display panels according to some embodiments of the present disclosure. Herein, cross sections in FIGS. 2 to 4 may be taken, for example, along a line A-A' in any one of FIGS. 5B to 5D.

For ease of illustration, in FIGS. 5A to 5D, only the display substrate 1, the hydrophobic bonding portion 31, and the hydrophilic bonding portion 32 in the display panel are illustrated, and the opposite substrate 2 in the display panel is not illustrated.

In some embodiments of the present disclosure, as shown in any one of FIGS. 5A to 5D, the hydrophobic bonding portion 31 surrounds the display region 1A, and the hydrophilic bonding portion 32 is disposed at at least one of a plurality of side surfaces of the hydrophobic bonding portion 31 facing the display region 1A.

That is to say, the orthographic projection of the hydrophobic bonding portion 31 on the display substrate 1 is in a shape of a square ring. Therefore, the hydrophobic bonding portion 31 is able to prevent moisture in the external environment from corroding the interior of the display panel from different directions.

In some example, a width W1 of the square ring is equal (or approximately equal); in some other examples, the width W1 of the square ring is not equal in different regions.

Moreover, the width W1 of the square ring may be adjusted according to a size of the frame region of the display substrate 1. For example, in a case where the size of the frame region of the display substrate 1 is large, the width W1 of the square ring may be set large; in a case where the size of the frame region of the display substrate 1 is small, the width W1 of the square ring may be set small.

Herein, the hydrophilic bonding portion 32 may be in a shape of, for example, a strip. In some example, a width W2 of the hydrophilic bonding portion 32 is equal (or approximately equal) along a direction in which the strip extends; in some other examples, the width W2 of the hydrophilic bonding portion 32 is not equal in different regions.

The above descriptions of width W1 and width W2 are merely examples, and some embodiments of the present disclosure are not limited thereto.

Figure 5A:
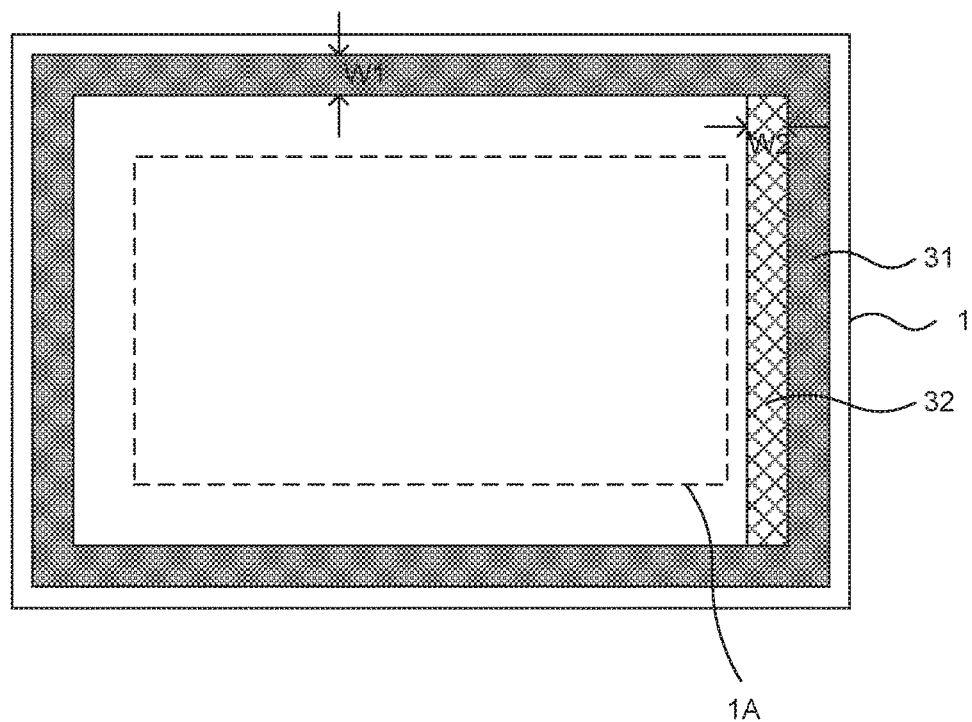
FIG. 5A is a schematic diagram showing a partial planar structure of a display panel according to some embodiments of the present disclosure.

As an example, the display region 1A is in a shape of a rectangle (or approximately a rectangle). As shown in FIG. 5A, the hydrophilic bonding portion 32 is disposed at any one side surface of four side surfaces of the hydrophobic bonding portion 31 facing the display region 1A.

Figure 5B:
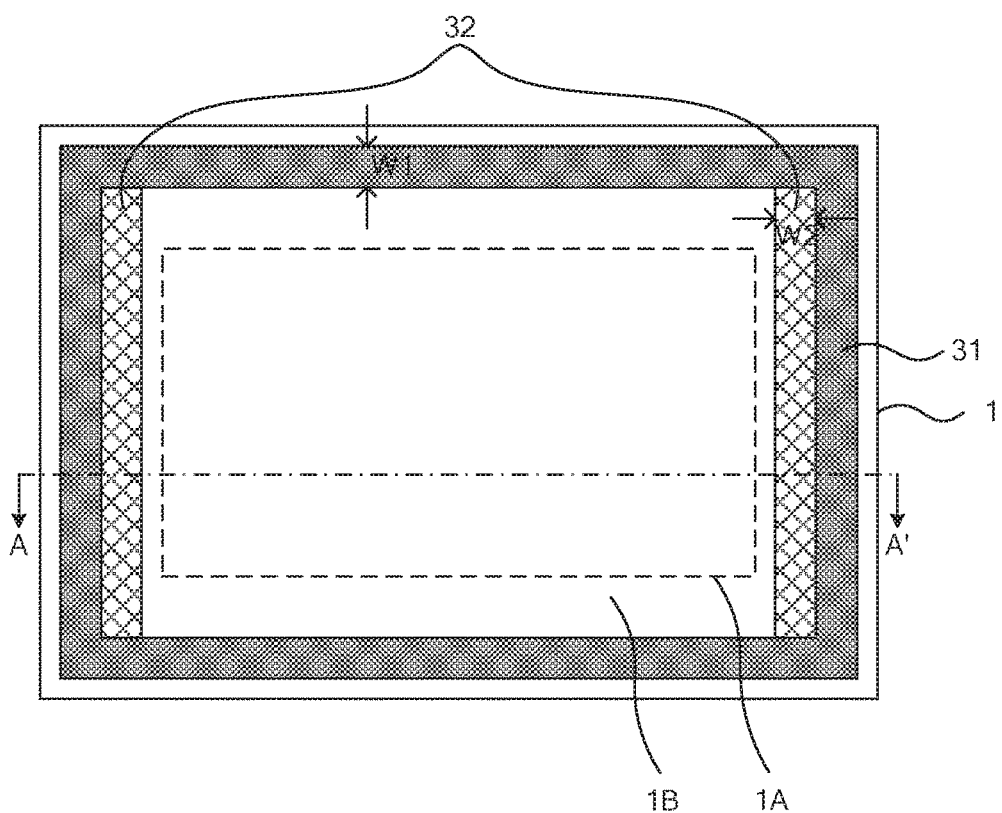
FIG. 5B is a schematic diagram showing a partial planar structure of another display panel according to some embodiments of the present disclosure.

Or, as shown in FIG. 5B, the hydrophilic bonding portion 32 is disposed at any two side surfaces of the four side surfaces of the hydrophobic bonding portion 31 facing the display region 1A.

In some embodiments, the any two side surfaces are two side surfaces that are opposite to each other. That is to say, one portion of the hydrophilic bonding portion 32 is disposed at one side surface, and the other portion of the hydrophilic bonding portion 32 is disposed at the other side surface.

In some other embodiments, the any two side surfaces are two side surfaces that are connected to each other. That is to say, the one portion of the hydrophilic bonding portion 32 is disposed at one side surface, and the other portion of the hydrophilic bonding portion 32 is disposed at the other side surface. Moreover, in a case where the any two side surfaces are two side surfaces that are connected to each other, in some examples, portions of the hydrophilic bonding portion 32 that are disposed at different side surfaces are connected to each other and thus form an integrated structure. In some other examples, the portions of the hydrophilic bonding portion 32 that are disposed at different side surfaces are not connected to each other.

Figure 5C:
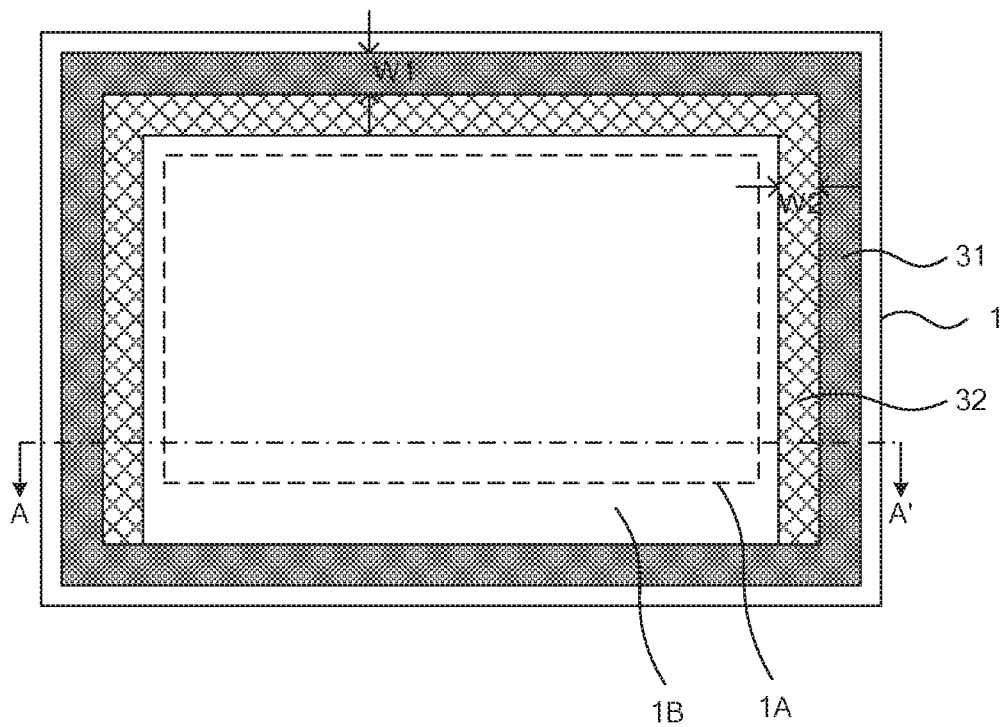
FIG. 5C is a schematic diagram showing a partial planar structure of yet another display panel according to some embodiments of the present disclosure.

Or, as shown in FIG. 5C, the hydrophilic bonding portion 32 is disposed at any three side surfaces of the four side surfaces of the hydrophobic bonding portion 31 facing the display region 1A. Herein, as for a manner in which the portions of the hydrophilic bonding portion 32 that are disposed at different side surfaces are connected, reference may be made to the foregoing description, and details are not described herein again.

Figure 5D:
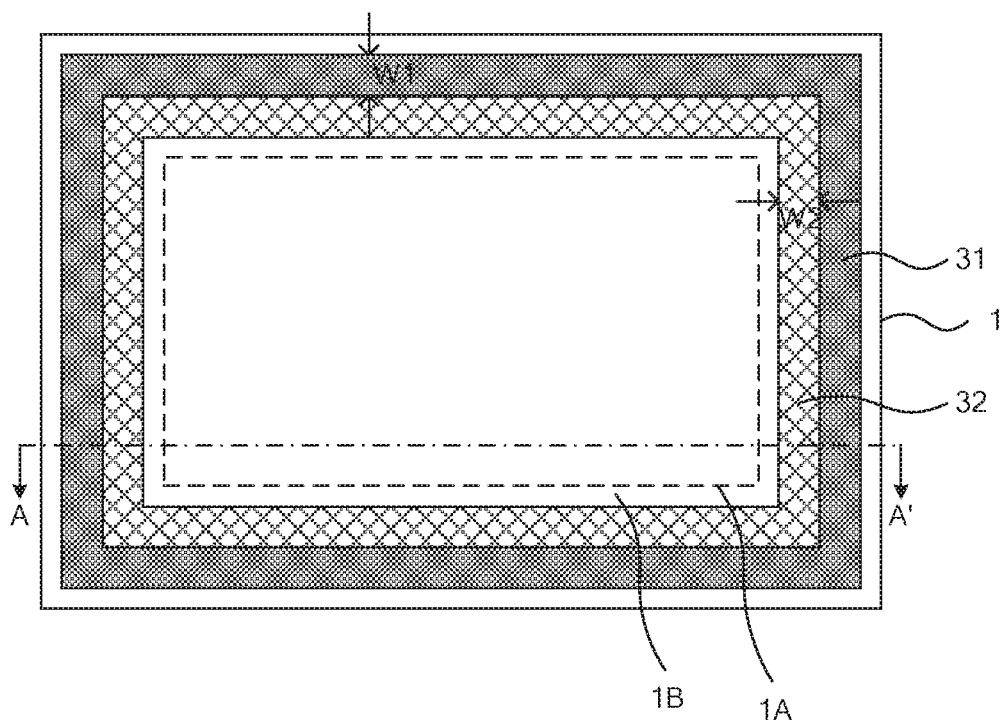
FIG. 5D is a schematic diagram showing a partial planar structure of yet another display panel according to some embodiments of the present disclosure.

Or, as shown in FIG. 5D, the hydrophilic bonding portion 32 is disposed at all the four side surfaces of the hydrophobic bonding portion 31 facing the display region 1A. In a case where portions of the hydrophilic bonding portion 32 that are disposed at all the four side surfaces are connected to each other and thus form an integrated structure, the orthographic projection of the hydrophilic bonding portion 32 on the display substrate 1 is in a shape of a square ring. Therefore, the hydrophilic bonding portion 32 is able to adsorb and fix the free moisture from different directions in the display panel, thereby further improving the ability of the display panel to resist moisture corrosion.

In some other embodiments of the present disclosure, a portion of the hydrophilic bonding portion 32 that is disposed at any one side surface of the hydrophobic bonding portion 31 facing the display region 1A may include a plurality of small bonding portions that are spaced apart.

In some embodiments of the present disclosure, as shown in any one of FIGS. 5A to 5D, the hydrophobic bonding portion 31 is in contact with the hydrophilic bonding portion 32.

Figure 5E:
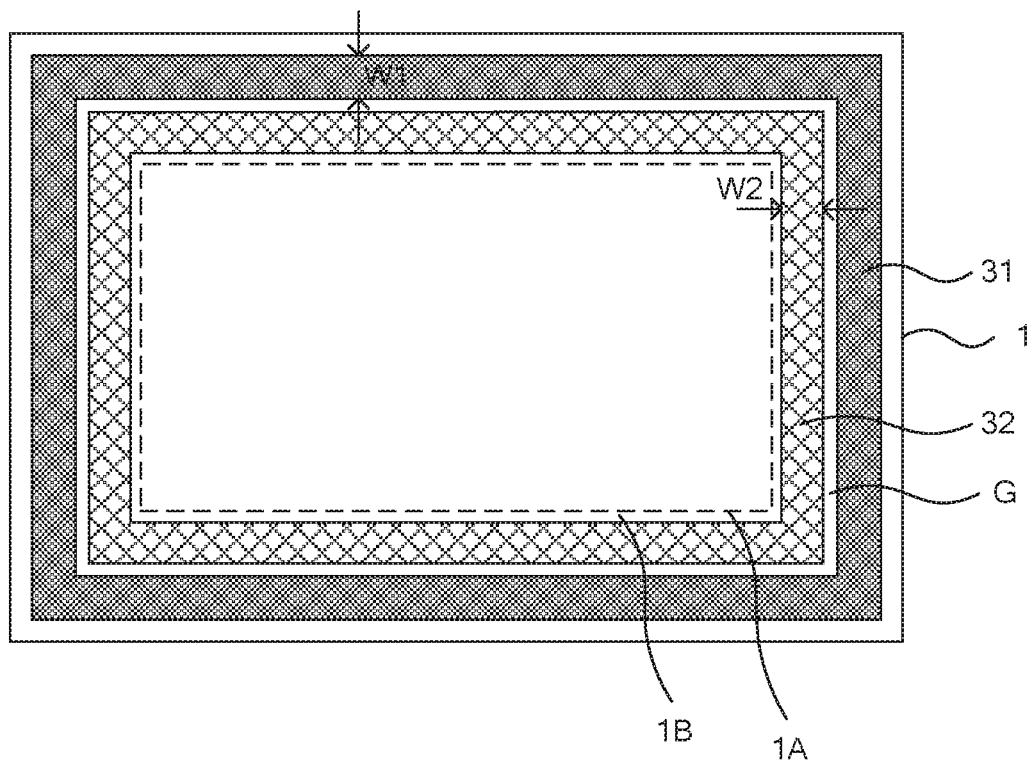
FIG. 5E is a schematic diagram showing a partial planar structure of yet another display panel according to some embodiments of the present disclosure.

FIG. 5E is a schematic diagram showing a partial planar structure of yet another display panel according to some embodiments of the present disclosure. As shown in FIG. 5E, there is a gap G between the hydrophobic bonding portion 31 and the hydrophilic bonding portion 32. In this case, an isolated space is formed to further prevent moisture corrosion.

It will be noted that, some embodiments of the present disclosure only take FIG. 5E as an example to illustrate the gap between the hydrophobic bonding portion 31 and the hydrophilic bonding portion 32. A structure of the hydrophilic bonding portion 32 may be set to a structure shown in any one of FIGS. 5A to 5C, and details are not described herein again.

Further, in some embodiments of the present disclosure, as shown in any one of FIGS. 5A to 5E, the hydrophilic bonding portion 32 is not connected to the display region 1A of the display substrate 1. In some other embodiments of the present disclosure, the hydrophilic bonding portion 32 is connected to the display region 1A of the display substrate 1. A specific arrangement manner may be adjusted accordingly according to the design requirements of the display panel, which is not limited herein.

Respective materials of the hydrophobic bonding portion 31 and the hydrophilic bonding portion 32 will be described below with some embodiments. It will be understood that, the following embodiments are merely illustrative, and do not constitute a limitation on materials of each bonding portion.

In some embodiments of the present disclosure, materials of the hydrophobic bonding portion 31 include a first base material and a hydrophobic material. The first base material is a main material constituting the hydrophobic bonding portion 31, and includes at least one of an ultraviolet curing adhesive or a heat curing adhesive.

In some embodiments of the present disclosure, materials of the hydrophilic bonding portion 32 include a second base material and a hydrophilic material. The second base material is a main material constituting the hydrophilic bonding portion 32, and includes at least one of an ultraviolet curing adhesive or a heat curing adhesive.

In some examples, the first base material in the hydrophobic bonding portion 31 is the same as the second base material in the hydrophilic bonding portion 32. For example, both base materials are ultraviolet curing adhesives; or, both base materials are heat curing adhesives; or, both base materials are mixtures of an ultraviolet curing adhesive and a heat curing adhesive, and a mixing ratio of the ultraviolet curing adhesive and the heat curing adhesive is the same. In this way, the two bonding portions may be manufactured by a same process or similar processes, and/or, the two bonding portions may be cured by a same process or similar processes. As a result, a manufacturing process of the display panel may be simplified.

In some other example, the first base material in the hydrophobic bonding portion 31 is not the same as the second base material in the hydrophilic bonding portion 32. For example, one base material is an ultraviolet curing adhesive, and the other base material is a heat curing adhesive; or, both base materials are mixtures of an ultraviolet curing adhesive and a heat curing adhesive, but a mixing ratio of the ultraviolet curing adhesive and the heat curing adhesive is not the same. In this way, specific performance requirements of different bonding portions may be met.

In some embodiments, in the materials of the hydrophobic bonding portion 31, arrangement manners of the hydrophobic material include at least one of the following arrangement manners: the hydrophobic material is dispersed in the first base material; or the hydrophobic material includes a plurality of hydrophobic groups, and the plurality of hydrophobic groups are connected to the first base material.

That is to say, in some examples, the materials of the hydrophobic bonding portion 31 include a first base material and a hydrophobic material that is dispersed in the first base material. Or, in some other examples, the materials of the hydrophobic bonding portion 31 include a first base material and a plurality of hydrophobic groups that are connected to the first base material. Or, in yet some other examples, the materials of the hydrophobic bonding portion 31 include a first base material and a hydrophobic material that is dispersed in the first base material, and a plurality of hydrophobic groups are connected to the first base material.

Thus, due to hydrophobicity of the hydrophobic material and/or the hydrophobic groups, the hydrophobic bonding portion 31 as a whole is rendered hydrophobic.

Optionally, the hydrophobic material includes at least one of plastic particles, hydrophobic nano-silica (usually refers to silica having a particle size in a range of 1 nm~100 nm), or paraffin.

It will be understood that the "particle" herein refers to a geometric body having a characteristic shape within a certain size range, and the certain size is usually from millimeters and nanometers. Therefore, the above-mentioned plastic particles refer to particles having a size of a small order of magnitude, and a specific microscopic shape thereof is not limited to a spherical shape, and may be various shapes, which is not specifically limited.

For example, the plastic particles include: at least one of polyolefin (e.g., polypropylene, polyethylene), fluorinated polyethylene, polyvinyl chloride, polystyrene, polyester (e.g., polyurethane), polyimide, polytetrafluoroethylene, polyoxymethylene, or polycarbosilane.

Optionally, any one of the plurality of hydrophobic groups is selected from a group consisting of a hydrocarbon group, an aryl group, an ester group, a nitro group, or a halogen atom.

In some embodiments, in the materials of the hydrophilic bonding portion 32, arrangement manners of the hydrophilic material include at least one of the following arrangement manners: the hydrophilic material is dispersed in the second base material; or the hydrophilic material includes a plurality of hydrophilic groups, and the plurality of hydrophilic groups are connected to the second base material.

That is to say, in some examples, the materials of the hydrophilic bonding portion 32 include a second base material and a hydrophilic material that is dispersed in the second base material. Or, in some other examples, the materials of the hydrophilic bonding portion 32 include a second base material and a plurality of hydrophilic groups that are connected to the second base material. Or, in yet some other examples, the materials of the hydrophilic bonding portion 32 include a second base material and a hydrophilic material that is dispersed in the second base material, and a plurality of hydrophilic groups are connected to the second base material.

Thus, due to hydrophilicity of the hydrophilic material and/or the hydrophilic groups, the hydrophilic bonding portion 32 as a whole is rendered hydrophilic.

Optionally, the hydrophilic material includes at least one of anhydrous magnesium sulfate, silica gel, cellulose (i.e., a macromolecular polysaccharide composed of glucose), aldehyde ketone resin, or acetone.

Optionally, any one of the plurality of hydrophilic groups is selected from a group consisting of a hydroxyl group, a carbonyl group, or an aldehyde group.

In some embodiments of the present disclosure, as shown in any one of FIGS. 5B to 5E, the orthographic projection of the hydrophobic bonding portion 31 on the display substrate 1 and the orthographic projection of the hydrophilic bonding portion 32 on the display substrate 1 are both located within a frame region 1B of the display substrate 1. The frame region 1B is located on at least one side around the display region 1A.

Since the display panel provided in some embodiments of the present disclosure has a hydrophobic bonding portion 31, along the direction from the frame region 1B of the display substrate 1 to the display region 1A of the display substrate 1, a content of moisture that may enter the display panel from the external environment is lower and lower.

Therefore, along the direction from the frame region 1B of the display substrate 1 to the display region 1A of the display substrate 1, a mass percentage of the hydrophobic material in the hydrophobic bonding portion 31 gradually decreases. That is to say, in the hydrophobic bonding portion 31, the closer to the display region 1A, the lower the mass percentage of the hydrophobic material; and the closer to an edge of the display substrate 1, the higher the mass percentage of the hydrophobic material.

In this manner, a content distribution of the hydrophobic material in the hydrophobic bonding portion 31 may be set more reasonably, so as to reduce cost.

For example, the hydrophobic material in the hydrophobic bonding portion 31 is concentrated on a surface of the hydrophobic bonding portion 31 that is not in contact with the display substrate 1 and the opposite substrate 2, and that is away from the display region 1A, so as to more effectively resist intrusion of moisture from the external environment.

Since the display panel provided in some embodiments of the present disclosure has a hydrophilic bonding portion 32, which is able to adsorb the free moisture inside the display panel, along the direction from the frame region 1B of the display substrate 1 to the display region 1A of the display substrate 1, a mass percentage of the hydrophilic material in the hydrophilic bonding portion 32 gradually increases. That is to say, in the hydrophilic bonding portion 32, the closer to the display region 1A, the higher the mass percentage of the hydrophilic material; and the closer to the hydrophobic bonding portion 31, the lower the mass percentage of the hydrophilic material.

In this manner, a content distribution of the hydrophilic material in the hydrophilic bonding portion 32 may be set more reasonably, so as to reduce cost.

For example, the hydrophilic material in the hydrophilic bonding portion 32 is concentrated on a surface of the hydrophilic bonding portion 32 that is not in contact with the display substrate 1 and the opposite substrate 2, and that faces the display region 1A, so as to more effectively fix the free moisture inside the display panel.

Considering that a moisture content in the external environment is high, and that even if there is free moisture in the region between the display substrate 1 and the opposite substrate 2, a content thereof is relatively low, in some embodiments of the present disclosure, it is arranged that a mass percentage of the hydrophobic material in the materials of the hydrophobic bonding portion 31 is greater than a mass percentage of the hydrophilic material in the materials of the hydrophilic bonding portion 32, so as to further reduce cost.

For example, the mass percentage of the hydrophobic material in the materials of the hydrophobic bonding portion 31 is 10%~40%; and the mass percentage of the hydrophilic material in the materials of the hydrophilic bonding portion 32 is 5%~20%.

In some embodiments of the present disclosure, a mass percentage of the first base material in the materials of the hydrophobic bonding portion 31 is less than a mass percentage of the second base material in the materials of the hydrophilic bonding portion 32. In this case, a relationship between the mass percentage of the hydrophobic material in the hydrophobic bonding portion 31 and the mass percentage of the hydrophilic material in the hydrophilic bonding portion 32 may be determined accordingly.

In this way, in a case where the hydrophobic bonding portion 31 and the hydrophilic bonding portion 32 have a same mass, the display substrate 1 and the opposite substrate 2 may be more closely bonded together by the second base material in the hydrophilic bonding portion 32.

Further, in some embodiments of the present disclosure, materials of the opposite substrate 2 include a hydrophilic material with a mass percentage of 2%~5%, and the hydrophilic material is concentrated on a surface of the opposite substrate 2 facing the display substrate 1. In this way, the free moisture in the region between the display substrate 1 and the opposite substrate 2 may be further absorbed, and the ability of the display substrate to resist moisture may be further improved.

As for a type of the hydrophilic material, reference may be made to the foregoing description, and details are not described herein again.

In some embodiments of the present disclosure, the display panel further includes a reflective film disposed on a surface of the opposite substrate 2 away from the display substrate 1, so as to improve a light utilization efficiency of the display substrate 1.

Some embodiments of the present disclosure provide a method of manufacturing the display panel provided in the above embodiments.

Figure 6:
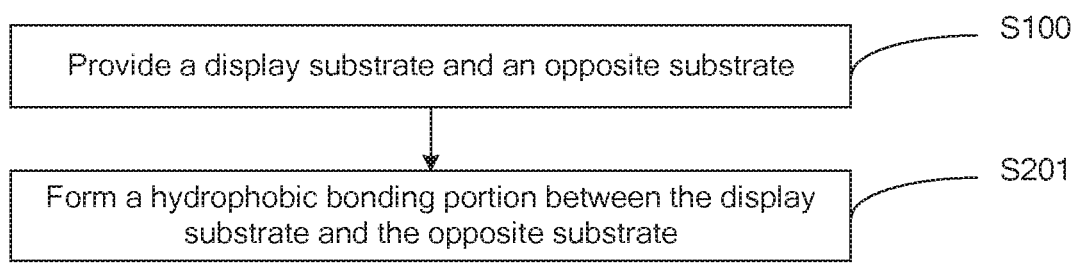
FIG. 6 is a flow chart of a method of manufacturing a display panel according to some embodiments of the present disclosure.

FIG. 6 is a flow chart of a method of manufacturing a display panel according to some embodiments of the present disclosure.

As shown in FIG. 6, the method of manufacturing the display panel includes steps 100 and 201 (S100-S201):

S100: providing a display substrate 1 and an opposite substrate 2; and

S201: forming a hydrophobic bonding portion 31 between the display substrate 1 and the opposite substrate 2.

The hydrophobic bonding portion 31 is configured to bond the display substrate 1 and the opposite substrate 2 together, and an orthographic projection of the hydrophobic bonding portion 31 on the display substrate 1 is located outside a display region 1A of the display substrate 1.

As for corresponding descriptions of the display substrate 1, the opposite substrate 2, and the hydrophobic bonding portion 31, reference may be made to the forgoing embodiments, and details are not described herein again. Moreover, the beneficial effects of the method are the same as the beneficial effects of the display panel provided in the foregoing embodiments of the present disclosure, and details are not described herein again.

Figure 7:
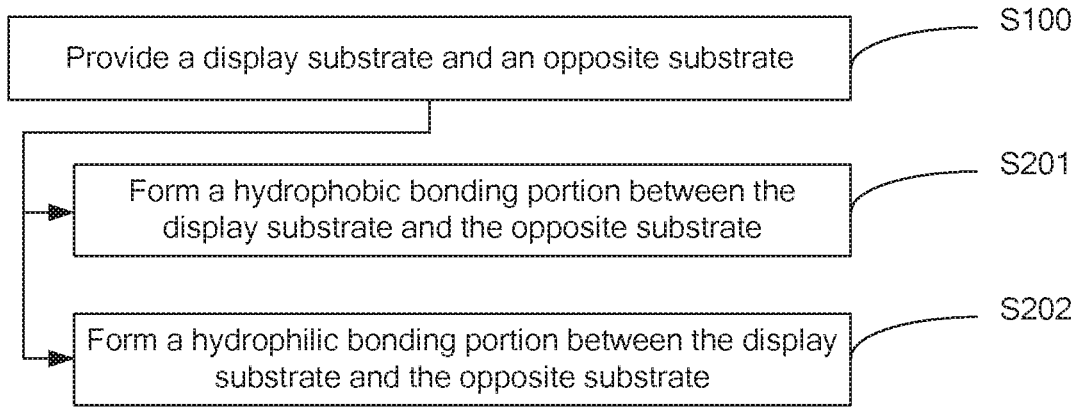
FIG. 7 is a flow chart of another method of manufacturing a display panel according to some embodiments of the present disclosure.

FIG. 7 is a flow chart of another method of manufacturing a display panel according to some embodiments of the present disclosure. In some embodiments, as shown in FIG. 7, the method of manufacturing the display panel further includes step 202 (S202): forming a hydrophilic bonding portion 32 between the display substrate 1 and the opposite substrate 2.

The hydrophilic bonding portion 32 is configured to bond the display substrate 1 and the opposite substrate 2 together, and an orthographic projection of the hydrophilic bonding portion 32 on the display substrate 1 is located between the orthographic projection of the hydrophobic bonding portion 31 on the display substrate 1 and the display region 1A of the display substrate 1.

As for corresponding descriptions of the hydrophilic bonding portion 32, reference may be made to the forgoing embodiments, and details are not described herein again.

It will be understood that in some examples, S201 is performed first, and then S202 is performed; in some other examples, S202 is performed first, and then S201 is performed; and in yet some other examples, S201 and S202 are performed simultaneously. An order of 201 and S202 may be adjusted according to specific structural requirements of the display panel, which is not limited in some embodiments of the present disclosure.

Figure 8A:
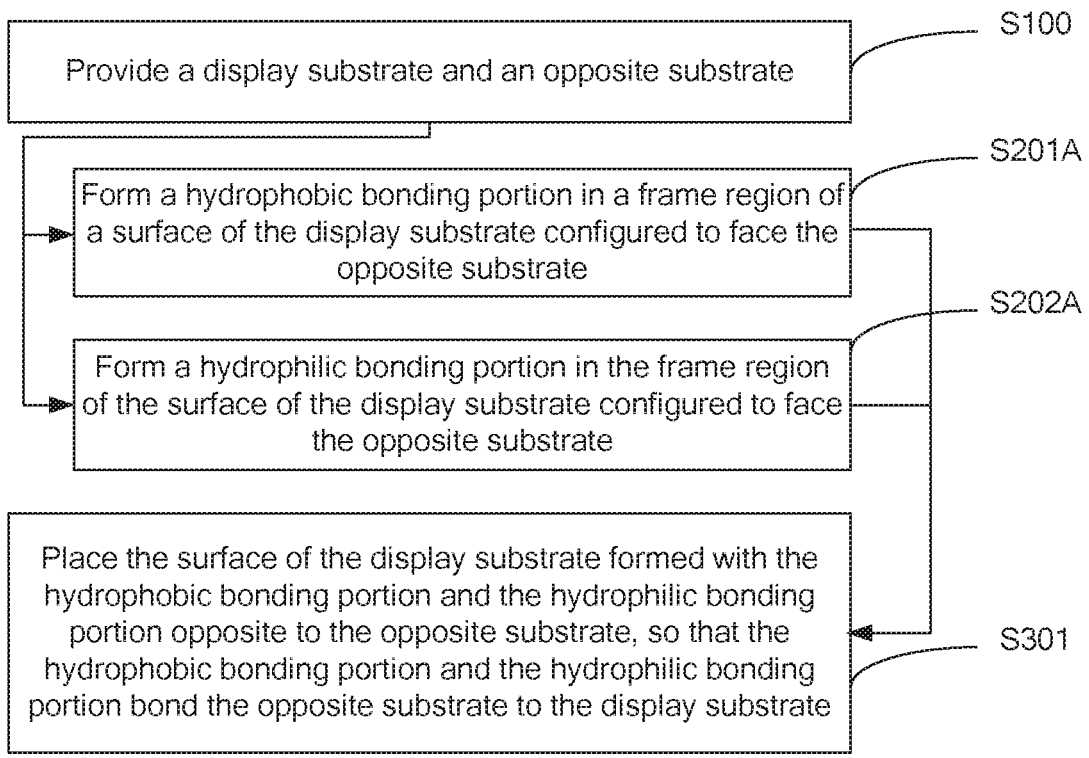
FIG. 8A is a flow chart showing a process in which a hydrophobic bonding portion and a hydrophilic bonding portion bond a display substrate and an opposite substrate together according to some embodiments of the present disclosure.
Figure 8B:
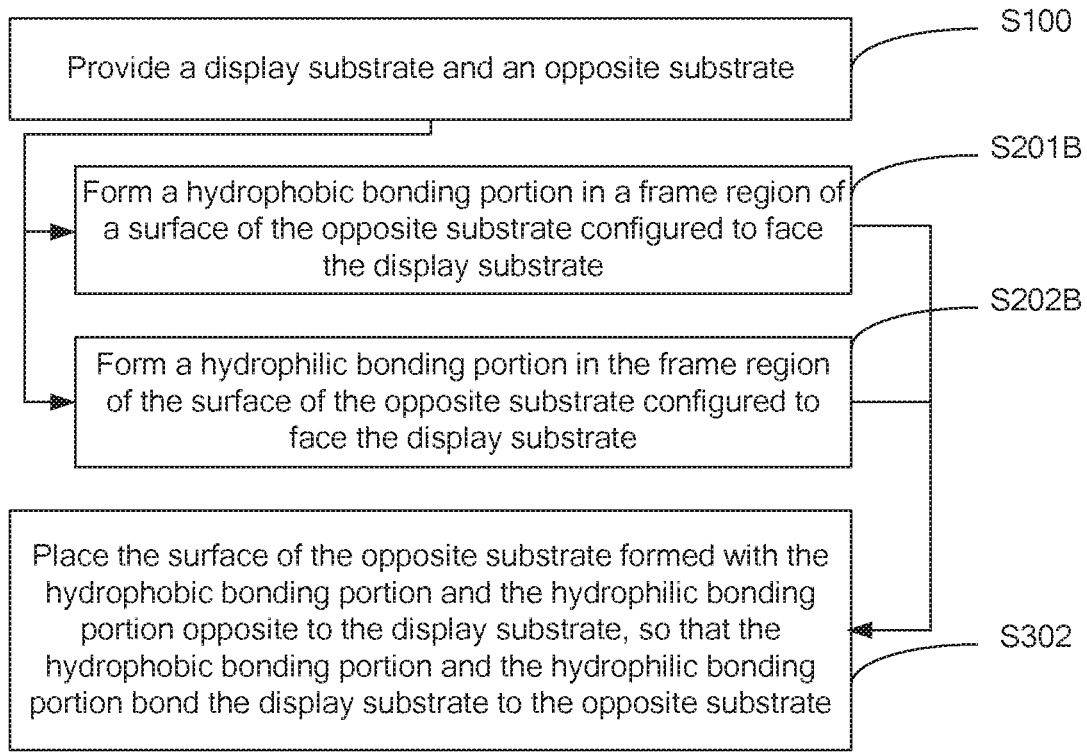
FIG. 8B is a flow chart showing another process in which a hydrophobic bonding portion and a hydrophilic bonding portion bond a display substrate and an opposite substrate together according to some embodiments of the present disclosure.

FIGS. 8A and 8B are flow charts showing difference processes in which the hydrophobic bonding portion and the hydrophilic bonding portion bond the display substrate and the opposite substrate together according to some embodiments of the present disclosure.

In some embodiments of the present disclosure, as shown in FIG. 8A, S201 includes step 201A (S201A): forming a hydrophobic bonding portion 31 in a frame region 1B of a surface of the display substrate 1 configured to face the opposite substrate 2 by, for example, a coating process.

As shown in FIG. 8A, S202 includes step 202A (S202A): forming a hydrophilic bonding portion 32 in the frame region 1B of the surface of the display substrate 1 configured to face the opposite substrate 2 by, for example, a coating process.

As shown in FIG. 8A, the method further includes step 301 (S301): placing the surface of the display substrate 1 formed with the hydrophobic bonding portion 31 and the hydrophilic bonding portion 32 opposite to the opposite substrate 2, so that the hydrophobic bonding portion 31 and the hydrophilic bonding portion 32 bond the opposite substrate 2 to the display substrate 1.

In some other embodiments of the present disclosure, as shown in FIG. 8B, S201 includes step 201B (S201B): forming a hydrophobic bonding portion 31 in a frame region of a surface of the opposite substrate 2 configured to face the display substrate 1 by, for example, a coating process.

As shown in FIG. 8B, S202 includes step 202B (S202B): forming a hydrophilic bonding portion 32 in the frame region of the surface of the opposite substrate 2 configured to face the display substrate 1 by, for example, a coating process.

It will be understood that, the frame region of the opposite substrate 2 refers to a region of the opposite substrate 2 other than a region of the opposite substrate 2 corresponding to the display region 1A of the display substrate 1. The frame region of the opposite substrate 2 corresponds to the frame region of the display substrate 1.

As shown in FIG. 8B, the method further includes step 302 (S302): placing the surface of the opposite substrate 2 formed with the hydrophobic bonding portion 31 and the hydrophilic bonding portion 32 opposite to the display substrate 1, so that the hydrophobic bonding portion 31 and the hydrophilic bonding portion 32 bond the display substrate 1 to the opposite substrate 2.

It will be understood that, the method of manufacturing the display panel provided in some embodiments of the present disclosure is not limited to manners shown in FIGS. 8A and 8B. For example, the frame region 1B of the display substrate 1 is coated with a bonding portion (for example, a hydrophobic bonding portion 31 or a hydrophilic bonding portion 32), and a corresponding position in the frame region of the opposite substrate 2 is coated with the other bonding portion (for example, a hydrophilic bonding portion 32 or a hydrophobic bonding portion 31). In this manner, the display substrate 1 and the opposite substrate 2 may also be bonded to each other by the hydrophobic bonding portion 31 and the hydrophilic bonding portion 32.

In some embodiments of the present disclosure, the method further includes step 400 (S400): performing a curing treatment on the hydrophobic bonding portion 31 and the hydrophilic bonding portion 32 that are formed between the display substrate 1 and the opposite substrate 2, so as to tightly fix the display substrate 1, the hydrophobic bonding portion 31, the hydrophilic bonding portion 32, and the opposite substrate 2 together.

Optionally, the curing treatment includes at least one of the following treatments: an ultraviolet light irradiation treatment or a heat treatment.

That is, in a case where the materials of the hydrophobic bonding portion 31 and the materials of the hydrophilic bonding portion 32 both include an ultraviolet curing adhesive, the hydrophobic bonding portion 31 and the hydrophilic bonding portion 32 that are formed between the display substrate 1 and the opposite substrate 2 are cured by ultraviolet light irradiation. An ultraviolet light intensity is, for example, 5000 MJ/cm$^2$ to 12000 MJ/cm$^2$.

Or, the hydrophobic bonding portion 31 and the hydrophilic bonding portion 32 that are formed between the display substrate 1 and the opposite substrate 2 are cured by both ultraviolet light irradiation and heating. A heating temperature is, for example, 100° C. to 120° C., and a heating time is, for example, 50 min to 70 min.

Specific parameters of the ultraviolet light irradiation and heating may be adjusted according to a process thereof, which are not limited in some embodiments of the present disclosure.

Figure 9:
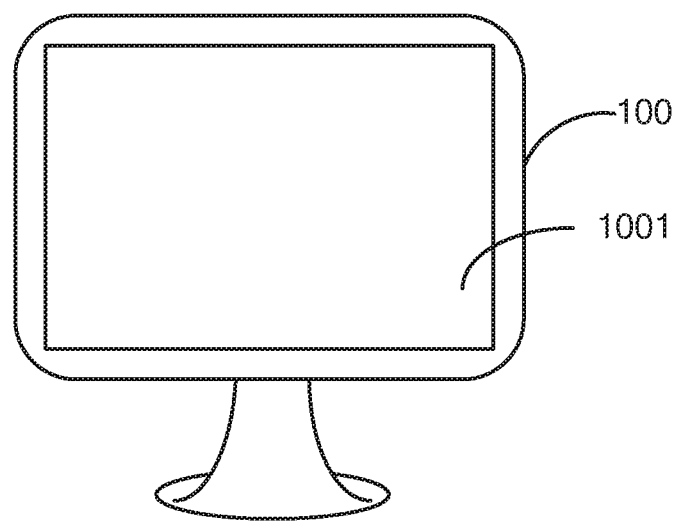
FIG. 9 is a schematic diagram showing a structure of a display device according to some embodiments of the present disclosure.

As shown in FIG. 9, embodiments of the present disclosure further provide a display device 100, which includes the display panel 1001 provided in the above embodiments.

For example, according to different design requirements of the display device 100, the display device 100 may further include other applicable structures, such as a driving circuit (including at least one of a gate driving circuit or a source driving circuit), a frame, and a backlight source (in a case where the display substrate in the display panel is the photoluminescent display substrate, the backlight source can provide a light source for the photoluminescent display substrate).

The beneficial effects of the display device provided in some embodiments of the present disclosure are the same as the beneficial effects of the display panel provided in the above embodiments, and details are not described herein again.

For example, the display device may be any product or component having a display function, such as a mobile phone, a tablet computer, a television, a display, a notebook computer, a digital photo frame, or a navigator.

In the above description of the embodiments, specific features, structures, materials or characteristics may be combined in any suitable manner in any one or more embodiments or examples.

The above descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising:
   a display substrate;
   an opposite substrate;
   a hydrophobic bonding portion disposed between the display substrate and the opposite substrate; and
   a hydrophilic bonding portion disposed between the display substrate and the opposite substrate; wherein
   the hydrophobic bonding portion is configured to bond the display substrate and the opposite substrate together, and an orthographic projection of the hydrophobic bonding portion on the display substrate is located outside a display region of the display substrate; materials of the hydrophobic bonding portion include a first base material and a hydrophobic material;

the hydrophilic bonding portion is configured to bond the display substrate and the opposite substrate together, and an orthographic projection of the hydrophilic bonding portion on the display substrate is located between the orthographic projection of the hydrophobic bonding portion on the display substrate and the display region of the display substrate; materials of the hydrophilic bonding portion include a second base material and a hydrophilic material; and a mass percentage of the first base material in the materials of the hydrophobic bonding portion is less than a mass percentage of the second base material in the materials of the hydrophilic bonding portion.

2. The display panel according to claim 1, wherein arrangement manners of the hydrophobic material include at least one of the following arrangement manners:

the hydrophobic material is dispersed in the first base material; or the hydrophobic material includes a plurality of hydrophobic groups, and the plurality of hydrophobic groups are connected to the first base material.

3. The display panel according to claim 2, wherein arrangement manners of the hydrophilic material include at least one of the following arrangement manners:

the hydrophilic material is dispersed in the second base material; or the hydrophilic material includes a plurality of hydrophilic groups, and the plurality of hydrophilic groups are connected to the second base material.

4. The display panel according to claim 3, wherein any one of the plurality of hydrophobic groups is selected from a group consisting of a hydrocarbon group, an aryl group, an ester group, a nitro group, or a halogen atom; and any one of the plurality of hydrophilic groups is selected from a group consisting of a hydroxyl group, a carbonyl group, or an aldehyde group.

5. The display panel according to claim 1, wherein the orthographic projection of the hydrophobic bonding portion on the display substrate and the orthographic projection of the hydrophilic bonding portion on the display substrate are both located within a frame region of the display substrate; and along a direction from the frame region of the display substrate to the display region of the display substrate, a mass percentage of the hydrophobic material in the hydrophobic bonding portion gradually decreases, and a mass percentage of the hydrophilic material in the hydrophilic bonding portion gradually increases.

6. The display panel according to claim 1, wherein a mass percentage of the hydrophobic material in the materials of the hydrophobic bonding portion is greater than a mass percentage of the hydrophilic material in the materials of the hydrophilic bonding portion.

7. The display panel according to claim 1, wherein a mass percentage of the hydrophobic material in the materials of the hydrophobic bonding portion is 10%~40%; and a mass percentage of the hydrophilic material in the materials of the hydrophilic bonding portion is 5%~20%.

8. The display panel according to claim 1, wherein the hydrophobic material includes at least one of plastic particles, hydrophobic nano-silica, or paraffin; and the hydrophilic material includes at least one of anhydrous magnesium sulfate, silica gel, cellulose, aldehyde ketone resin, or acetone.

9. The display panel according to claim 1, wherein the first base material includes at least one of an ultraviolet curing adhesive or a heat curing adhesive; and the second base material includes at least one of an ultraviolet curing adhesive or a heat curing adhesive.

10. The display panel according to claim 1, wherein materials of the opposite substrate include a hydrophilic material with a mass percentage of 2%~5%, and the hydrophilic material is distributed on a surface of the opposite substrate facing the display substrate.

11. The display panel according to claim 1, wherein the hydrophobic bonding portion surrounds the display region; and the hydrophilic bonding portion is disposed at at least one of a plurality of side surfaces of the hydrophobic bonding portion facing the display region.

12. The display panel according to claim 1, further comprising: a gap disposed between the hydrophobic bonding portion and the hydrophilic bonding portion.

13. A display device, comprising the display panel according to claim 1.

14. A method of manufacturing a display panel, comprising:

providing a display substrate and an opposite substrate;

forming a hydrophobic bonding portion between the display substrate and the opposite substrate; and forming a hydrophilic bonding portion between the display substrate and the opposite substrate; wherein the hydrophobic bonding portion is configured to bond the display substrate and the opposite substrate together, and an orthographic projection of the hydrophobic bonding portion on the display substrate is located outside a display region of the display substrate; materials of the hydrophobic bonding portion include a first base material and a hydrophobic material;

the hydrophilic bonding portion is configured to bond the display substrate and the opposite substrate together, and an orthographic projection of the hydrophilic bonding portion on the display substrate is located between the orthographic projection of the hydrophobic bonding portion on the display substrate and the display region of the display substrate; materials of the hydrophilic bonding portion include a second base material and a hydrophilic material; and a mass percentage of the first base material in the materials of the hydrophobic bonding portion is less than a mass percentage of the second base material in the materials of the hydrophilic bonding portion.

15. The method of manufacturing the display panel according to claim 14, wherein forming a hydrophobic bonding portion between the display substrate and the opposite substrate, includes:

forming a hydrophobic bonding portion in a frame region of a surface of the display substrate configured to face the opposite substrate;

forming a hydrophilic bonding portion between the display substrate and the opposite substrate, includes:

forming a hydrophilic bonding portion in the frame region of the surface of the display substrate configured to face the opposite substrate; and the method further comprises:

placing the surface of the display substrate formed with the hydrophobic bonding portion and the hydrophilic bonding portion opposite to the opposite substrate, so that the hydrophobic bonding portion and the hydrophilic bonding portion bond the opposite substrate to the display substrate;

or,
forming a hydrophobic bonding portion between the display substrate and the opposite substrate, includes:
forming a hydrophobic bonding portion in a frame region of a surface of the opposite substrate configured to face the display substrate;
forming a hydrophilic bonding portion between the display substrate and the opposite substrate, includes:
forming a hydrophilic bonding portion in the frame region of the surface of the opposite substrate configured to face the display substrate; and
the method further comprises:
placing the surface of the opposite substrate formed with the hydrophobic bonding portion and the hydrophilic bonding portion opposite to the display substrate, so that the hydrophobic bonding portion and the hydrophilic bonding portion bond the display substrate to the opposite substrate.

16. The method for manufacturing a display panel according to claim 14, further comprising: performing a curing treatment on the hydrophobic bonding portion and the hydrophilic bonding portion that are formed between the display substrate and the opposite substrate, wherein
the curing treatment includes at least one of the following treatments: an ultraviolet light irradiation treatment or a heat treatment.

* * * * *